United States Patent
Hartl

(10) Patent No.: US 9,585,268 B2
(45) Date of Patent: Feb. 28, 2017

(54) HOUSING COMPONENT

(71) Applicant: Schott AG, Mainz (DE)

(72) Inventor: Helmut Hartl, Vienna (AT)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 14/087,405

(22) Filed: Nov. 22, 2013

(65) Prior Publication Data

US 2014/0146494 A1  May 29, 2014

(30) Foreign Application Priority Data

Nov. 23, 2012  (DE) .................. 10 2012 022 960

(51) Int. Cl.
*H05K 7/04* (2006.01)
*H05K 5/02* (2006.01)
*H05K 5/00* (2006.01)

(52) U.S. Cl.
CPC ......... *H05K 5/0247* (2013.01); *H05K 5/0082* (2013.01); *H05K 7/04* (2013.01); *H01L 2924/0002* (2013.01); *Y10T 29/49826* (2015.01); *Y10T 29/49993* (2015.01)

(58) Field of Classification Search
CPC ........... H05K 7/02; H05K 7/04; H05K 5/0247
USPC ....... 361/707, 714, 728–730, 752, 753, 796, 361/800; 174/50, 50.52, 252; 72/362; 257/712, 713, 678, 693, 666; 29/428; 438/121
See application file for complete search history.

(56) References Cited

U.S. PATENT DOCUMENTS

| 5,053,853 A * | 10/1991 | Haj-Ali-Ahmadi et al. . 257/693 |
| 5,940,279 A * | 8/1999 | Gademann et al. .......... 361/823 |
| 6,906,414 B2 * | 6/2005 | Zhao ....................... H01L 23/13 257/706 |
| 7,145,076 B2 * | 12/2006 | Knappen et al. ............ 174/50.6 |
| 7,736,573 B2 | 6/2010 | Zimmerman |
| 8,174,096 B2 * | 5/2012 | Chi Chan .......... H01L 21/4842 257/666 |
| 8,792,242 B2 * | 7/2014 | Wetzel et al. ................ 361/707 |
| 2005/0190539 A1* | 9/2005 | Watanabe et al. ........... 361/704 |

FOREIGN PATENT DOCUMENTS

| JP | 62274755 A | 11/1987 |
| JP | 02125460 A | 5/1990 |
| JP | 2000068439 A | 3/2000 |
| JP | 2003-68907 A | 3/2003 |
| JP | 2003-183842 A | 7/2003 |
| JP | 2004063830 A | 2/2004 |

(Continued)

OTHER PUBLICATIONS

French Search Report dated Aug. 17, 2015 for French Application No. 1361202 (6 pages).

*Primary Examiner* — Dimary Lopez Cruz
(74) *Attorney, Agent, or Firm* — Taylor IP, P.C.

(57) ABSTRACT

A housing component, for example a housing which accommodates electronics, such as a transmission control has a plurality of feedthroughs and a flatness zone. The housing component has a recess area in the region of the flatness zone. The housing component is reinforced through the recess and the flatness zone, which is disposed in the region of the recess, has a deviation from flatness of ≤0.1 millimeter (mm), for example in the range of 0.005 mm to 0.02 mm per 10 mm length.

24 Claims, 4 Drawing Sheets

(56) References Cited

FOREIGN PATENT DOCUMENTS

| JP | 2007333912 A | 12/2007 |
|----|--------------|---------|
| JP | 2008042011 A | 2/2008  |
| JP | 2009026871 A | 2/2009  |
| JP | 2009141172 A | 6/2009  |
| JP | 2010-93146 A | 4/2010  |

* cited by examiner

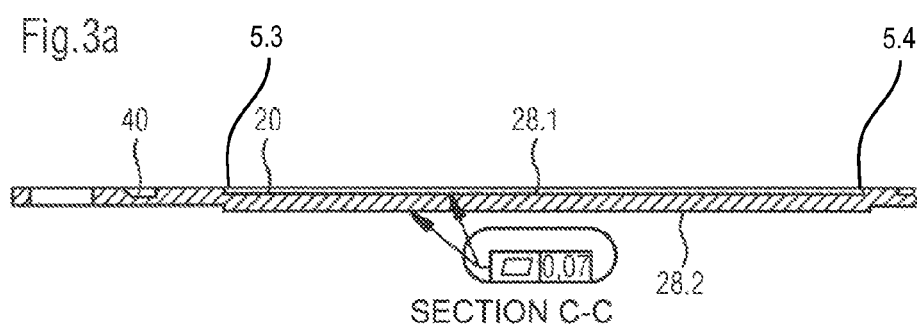
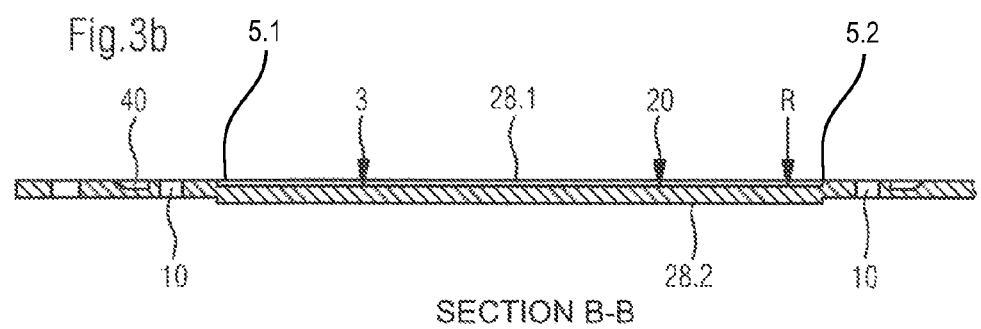

SECTION WITH METAL PINS

HOUSING COMPONENT

BACKGROUND OF THE INVENTION

1. Field of the Invention

The present invention relates to a housing component, for example a housing which accommodates electronics, such as a transmission control, having a plurality of feedthroughs and a flatness zone. It moreover relates to a method to produce a housing component, for example for a housing which accommodates electronics, such as a transmission control as well as a transmission control with circuit substrate and a housing component.

2. Description of the Related Art

Housings for electronic components, in particular control components, such as control components which are used for a transmission control generally include a housing component with a plurality of feedthroughs in order to guide wires from outside the control, for example from sensors, to the controls accommodated in the housing.

In order to cool the electronic components the current state of the art provides that the electronic components are disposed against the inside of the housing component. Due to uneven surfaces, in particular after a heat treatment during sealing, for example of feedthroughs, the dissipated heat from the electronics accommodated in the housing can only be removed with difficulty.

What is needed in the art is to overcome the disadvantages of the current state of the art. In particular, a housing component should be specified which allows the heat from an electronic component which is enclosed in the housing to be removed reliably and as effectively as possible.

SUMMARY OF THE INVENTION

The present invention provides a housing component, for example for an electronics housing, such as a transmission control, with a plurality of feedthroughs. A flatness zone is provided and the housing component includes a recess in the region of the flatness zone which is configured such that the housing component is reinforced through the recess.

Moreover, a flat surface is provided in the flatness zone, for example on the surface facing the inside of the housing, which has a deviation from flatness of ≤0.1 millimeters (mm), for example in the range of between approximately 0.005 mm and 0.02 mm per 10 mm length.

Flatness in the context of this application is to be understood to be a geometric tolerance according to the tolerance types for geometric description according to ISO 1101. Flatness, according to "Tolerance management" by Prof. Dr. Bernd Klein, University of Kassel, FB15, FG lightweight construction, Mönchbergstr. 7, 34109 Kassel 2011, pages 40-45, the disclosure content of which is incorporated herein in its entirety becomes a requirement for a surface area in itself. The flatness deviation is the largest distance between an adjacent plane and the real surface. The tolerance zone is limited by two parallel planes at distance $t_E$. All points of the real surface or the derived median plane are located between the two parallel planes having the tolerance measurement distance $t_E$.

For example in one embodiment of the present invention, without restriction thereto, the flatness zone measures 60×60 mm. With a thickness of the work piece of 1.5 mm, the deviation from the flatness being less than 0.1 mm. This means that in this embodiment it is in the range of between approximately 0.005 mm and 0.02 mm per 10 mm length.

In the current state of the art the housing components are generally machined in order to achieve the desired flatness. Due to the sealed in pins protruding from the feedthroughs in the base body such refinishing by machining is sometimes difficult, in some cases even impossible. Moreover, for machining, the housing component which is to be worked on must be clamped. This has the disadvantage that the housing component which is to be worked on can possibly be warped through such clamping and be deformed again when unclamping.

The housing component according to the present invention is therefore a component, for example produced in a stamping process.

In the region of the flatness zone the housing component has a thickness, for example in the range of between approximately 1 mm to 3 mm. The extension of the substantially rectangular flatness zone in each of the two spatial directions (x- and y-direction) is between approximately 30 and 100 mm, for example 40 to 80 mm. The deviations from the flatness then occur essentially perpendicular to the extension, in other words substantially in the z-direction.

In a further embodiment of the present invention at least one side—for example the inside—of the housing component is joined, for example through a positive material joint with an electronic component, for example a transmission control which is accommodated in the housing component. The other side of the flatness zone of the housing component can be connected for example with a cooling block on the outside or respectively the outside surface. Due to the great flatness of the inventive housing component with a deviation of ≤0.1 mm, for example in the range of 0.005 mm to 0.02 mm per 10 mm length in the flatness zone, a heat dissipation of the electronic components which are connected with the flatness zone can be removed very reliably and efficiently from the housing component. This is especially supported if the outside of the housing component is equipped, for example, with a cooling device.

The housing component may include along one side or several of sides of the housing component a plurality of feedthroughs from the outside into the interior of the housing. The plurality of feedthroughs may be arranged along one side in one row or possibly also in several rows. The individual feedthroughs include a feedthrough opening which is introduced into the housing component for example through punching. The size of the feedthrough opening is for example in the range of between 1.5 to 3.0 mm, or in the range of between 2.0 and 2.5 mm. Metallic conductors, for example metal pins with a pin head are inserted in an insulating material, such as a glass or glass ceramic material into the feedthrough openings which were introduced into the housing component through stamping. The insulating material, for example glass or glass ceramic material, is placed between the edge of the feedthrough openings and the metal pin. In a first arrangement, the housing component which in the feedthrough openings contains a glass or glass ceramic material and the metal pin is then heated so that the metal shrinks in a cooling process, thus establishing a frictional connection between the glass plug and metal pin on the one hand, and between the glass plug and housing component on the other hand. Thus a positive material fit connection is created during cooling between the outside circumference of the metal pin as well as the inside circumference of the feedthrough opening. This type of seal is also referred to as compression seal.

In addition to the aforementioned compression seal it is also conceivable to provide an adapted feedthrough. This means that the material of the housing component into which the feedthrough openings are introduced, as well as that of the metal pin and the sealing material, for example the glass or glass ceramic material have substantially the same coefficient of expansion. In such a case of an adapted feedthrough there is essentially a frictional connection between sealing material and feedthrough and metal pin and sealing material, and not a material fit as is the case with a compression seal.

An additional embodiment of the present invention provides that the housing includes a beading. The formation of the bead has the advantage that this can be filled with an adhesive. The adhesive embedded in the bead can be used to join, for example materially join the electronic substrate with the flatness zone of the housing component. The bead forms when creating the recess, whereby the thickness of the housing is displaced vertically downward, that is in the direction of the outside of the housing component. In such a case the bead is formed toward the top that is in the direction of the inside. By creating the recess, for example using a stamp which acts upon the housing component in the region of an opening, a stiffening of the housing component is created. The region of the recess can moreover be provided with an adhesive with which the electronics or respectively the circuitry which are arranged on the inside of the housing component can be materially joined with same. If the recess is introduced as described, then the outside of the flatness zone with which the cooling device will be connected protrudes.

In addition to the housing component a method for producing the housing component is also described, which applies to a housing which accommodates electronics, such as a transmission control. The housing component consists of a material, for example a metal such as for example high grade steel, steel, standard steel, NiFe or a NiFeCo-alloy and is essentially a plate shaped component with a plurality of feedthrough openings. The plate shaped component has a substantially greater extension in the x- and y-direction, compared to thickness d (in the z-direction).

According to the inventive method the plate shaped component is first provided with a recess whereby the plate shaped component is being strengthened by the recess. In the recess the flatness zone is formed with a flatness with a deviation of ≤0.1 mm, for example in the range of 0.005 mm to 0.02 mm per 10 mm length is provided, without for example machining rework of the housing component becoming necessary.

When creating the recess the plate thickness is not altered. Only the material is being displaced, for example through reshaping such as stamping.

In accordance with an additional embodiment method, a beading is formed by the recess which, in an additional process step can be filled with an adhesive.

In addition to the housing component and the method to provide a housing component, the present invention also specifies an electronic control, for example a transmission control having a circuit substrate and a housing component according to the present invention. The circuit substrate is connected with the housing component in the flatness zone, for example through adhesion. Since the adhesion occurs in the region of the flatness zone with very high flatness, the dissipated heat from the electronic which is bonded onto the flatness zone can be discharged very effectively over the floor of the housing component to the outside, for example through a cooling block which is pressed onto the housing component.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 3a is a sectional view along line C-C of the housing component of FIG. 1 according to the present invention;

FIG. 3b is a sectional view along sectional line B-B of the component of FIG. 1 according to the present invention;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
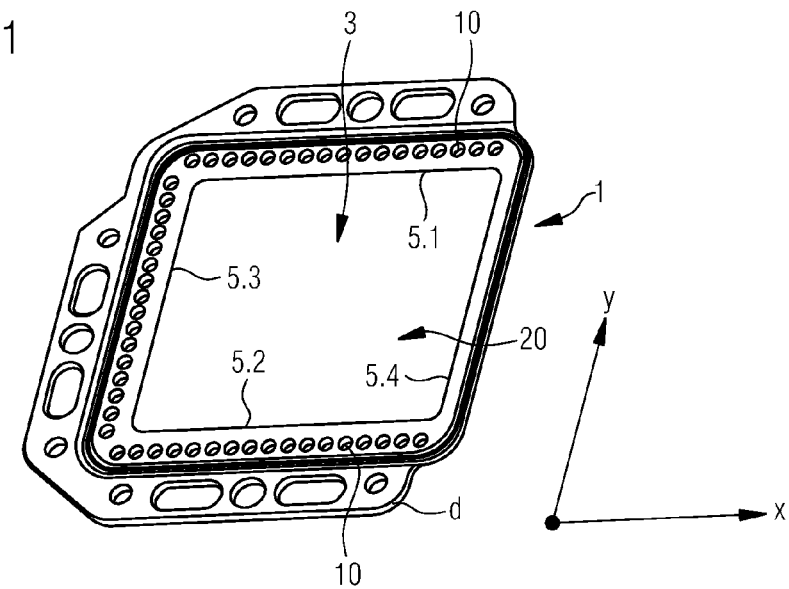
FIG. 1 is a three-dimensional view of a housing component according to the present invention.

Referring now to the drawings, and more particularly to FIG. 1, there is shown a top view of a housing component 1 according to the present invention. Housing component 1 according to the present invention is part of a housing in which, for example electronics, such as a transmission control are encapsulated or accommodated.

Flatness zone 3 of housing component 1 is clearly recognizable. Housing component 1 is, for example, plate shaped having limited thickness d, compared with the extensions in the x- and y-direction. Thickness d of the housing component is, for example in the range of between approximately 1 mm to 3 mm and the extension in the x- and y-direction is, for example, in the range of between approximately 30 mm and 100 mm. In the current housing component 1, flatness zone 3 is substantially rectangular with four sides 5.1, 5.2, 5.3 and 5.4. The four sides 5.1, 5.2, 5.3, and 5.4 together define a continuous unbroken boundary around the flatness zone 3.

In the illustrated embodiment of the present invention—without limitation thereto—a plurality of feedthrough openings 10 are respectively arranged in one row on three of the four sides, namely on sides 5.1, 5.2 and 5.3. An arrangement of several rows is also conceivable if the base body is to accommodate more feedthroughs. This arrangement is, however not mandatory.

Recess 20 which defines flatness zone 3 is clearly recognizable. Recess 20 strengthens the plate shaped base body. The material of the base body is for example a metal, such as a steel, high grade steel, standard steel, NiFe or a NiFeCo-alloy. FIG. 1 depicts the base body after introduction of the recess through reshaping, for example through stamping. By introducing the recess, the flatness zone is formed and the substantially plate shaped body strengthened. This is clearly visible in sectional views B-B and C-C (FIGS. 3a-3b).

Figure 2:
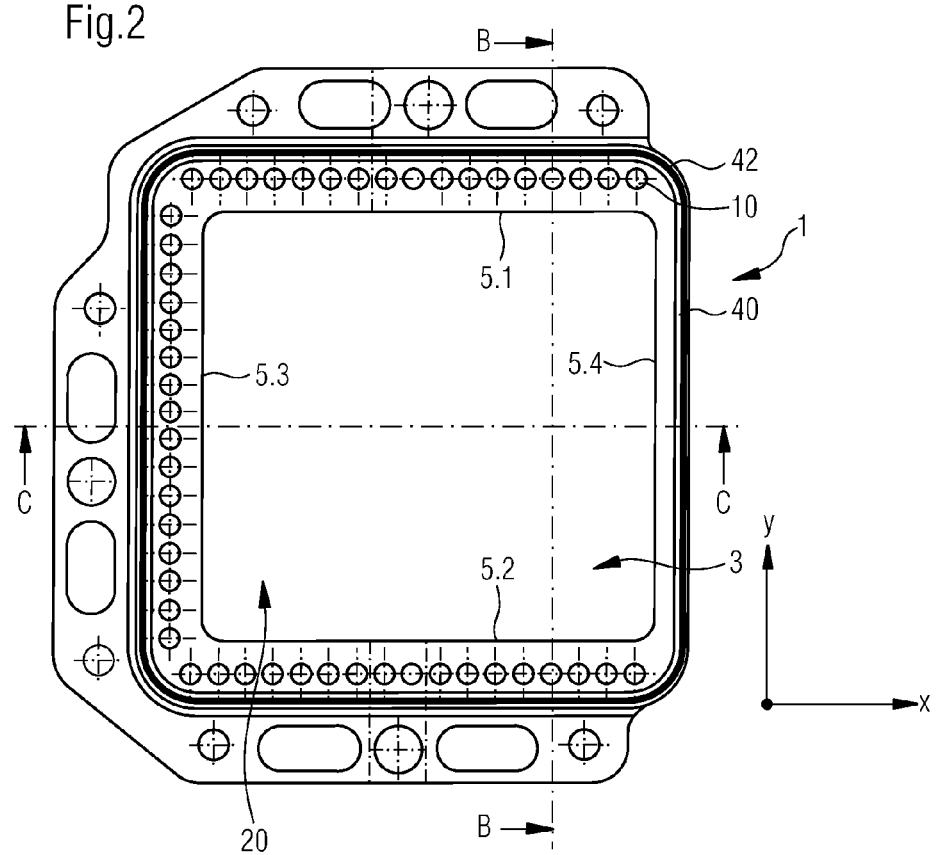
FIG. 2 is a top view onto a housing component of FIG. 1 according to the present invention.

In the top view illustrated in FIG. 2, same components as shown in FIG. 1 are identified with the same reference numbers. Clearly visible in the top view are feedthrough openings 10 which are arranged in a row at the edges of the housing component outside the recess, as well as seal 42 which is formed at the edge of the substantially plate shaped body through reshaping, for example embossing. Seal 42 includes a welding bead caused by embossing. A metal cap may for example, be placed on the welding bead. The metal cap can be connected, for example, hermetically sealed with the inventive component in the region of the welding bead using resistance welding.

FIGS. 3a and 3b illustrate sections along sections C-C (FIG. 3a) and B-B (FIG. 3b). Clearly visible in FIG. 3a is recess 20 in a region of the flatness zone 3. Also indicated in FIG. 3a is deviation $t_E$ from the flatness, as well as from the top side or inside 28.1 of the recess which faces the electronic component, and lower side or respectively outside 28.2 of flatness zone 3. The value of the tolerance measurement $t_E$ in flatness zone 3 is indicated as being 0.07 mm in the illustrated embodiment, for the inside 28.1 as well as outside 28.2 without limitation thereto. The tolerance measurement $t_E$ is to be equated with the deviation from flatness. Also visible is a seal 42 (FIG. 2) to adjacent housing components of the housing which accommodates the electronics.

In the illustration according to FIG. 3b (B-B) flatness zone 3 is again recognizable, as well as two feedthrough openings 10 without sealing and pin material. Same components as in FIG. 3a are identified with the same reference numbers. Clearly visible is direction R in which the tool, for example the reshaping tool, such as a stamp is used to produce recess 20 by acting upon the plate shaped work piece. Direction R may also be identified as the stamping direction. The reshaping tool, such as a stamp, produces recess 20 by directly displacing the flatness zone 3 in shear relative to the four sides 5.1, 5.2, 5.3, and 5.4 along the continuous unbroken boundary between the flatness zone 3 and the four sides 5.1, 5.2, 5.3, and 5.4. Specifically, direct displacement of the flatness zone 3 takes place along planar boundaries between the flatness zone 3 and each of the four sides 5.1, 5.2, 5.3, and 5.4, such that the discontinuity between the upper surface of the edges of the housing component 1 outside the recess 20 and the upper surface of the flatness zone 3 within the recess 20 is approximately superimposed over the discontinuity between the lower surface of the edges of the housing component 1 outside the recess 20 and the lower surface of the flatness zone 3 opposite the recess 20.

Figure 4:
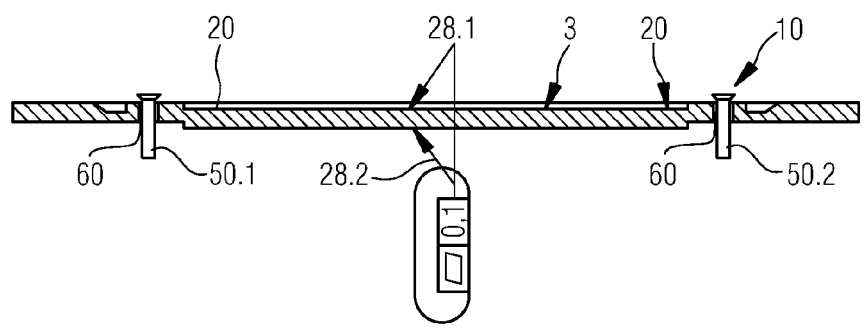
FIG. 4 a sectional view along a sectional line B-B with metal pins sealed into the feedthrough.

In an additional process step the metal pin, together with the sealing material is now being sealed into feedthrough openings 10, for example using heating. A sectional view along section B-B as shown in FIG. 3b is shown in FIG. 4 with metal pin 50.1, 50.2 sealed into feedthrough openings 10. Glass material 60 is placed between the metal pin and the feedthrough opening, resulting in the glass-metal connection. Deviation $t_E$ from the flatness following sealing in of the metal pins according to FIG. 4 is in the range of ≤0.1 mm for surfaces 28.2, 28.2 of flatness zone 3. This means the tolerance measurement tE from the flatness has not increased significantly due to the thermal load during sealing and is 0.1 mm. For example, the change of $t_E$ due to thermal load is no more than 50% with regard to value $t_E$ of the material not provided with a seal; for example it is in the range of 10% to 45%. If for example before sealing the value of $t_E$=0.07 mm and the value of $t_E$ increases to 0.1 mm as in the illustrated embodiment, then the deviation from the value prior to sealing is approximately 43%. According to a further inventive embodiment the flatness zone is provided completely with an adhesive which serves to connect a substrate which is arranged in the region of the flatness zone with the housing component, in order to thereby ensure good heat dissipation.

Figure 5:
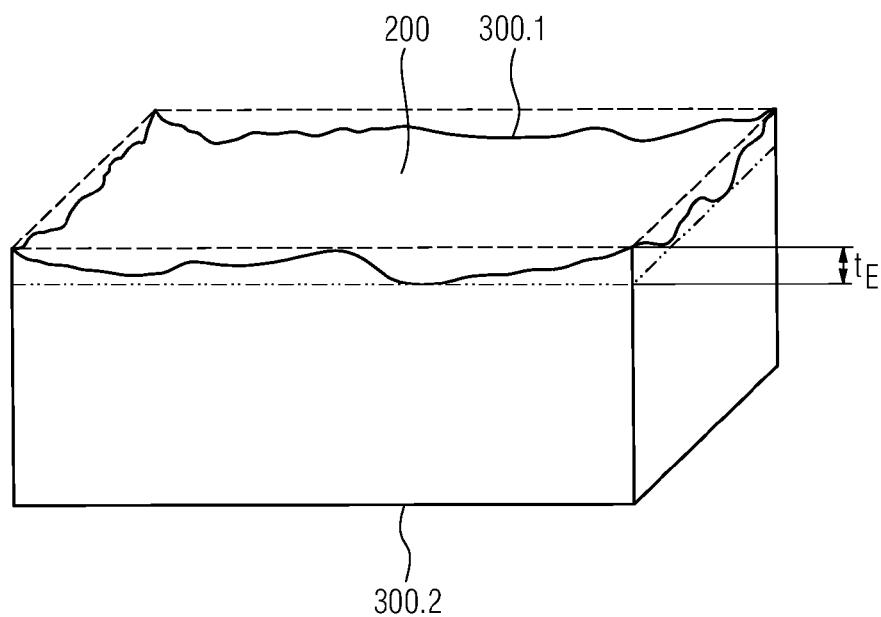
FIG. 5 is a perspective view of a surface of a housing component according to the present invention.

In FIG. 5 the deviation from the flatness is shown in for surface 200. As can be seen in FIG. 5, the surface is uneven. Flatness of the surface can be quantified through the distance or respectively tolerance measurement $t_E$. $t_E$ is thereby the distance of two parallel planes 300.1, 300.2. The greatest distance between an adjoining plane and the actual plane is the flatness deviation. Distance $t_E$ is a tolerance measurement within whose limits the uneven actual surface 200 is disposed. In the current example the tolerance measurement $t_E$ is consistent with the flatness deviation.

The present invention specifies for the first time a housing component of a housing for an electronics housing which has a great degree of flatness with a deviation from the flatness in the range of ≤0.1 mm, for example in the range of 0.005 mm to 0.02 mm per 10 mm length over the entire flatness zone is provided. This is advantageously possible without expensive machining rework of the housing component, simply by a reshaping process, for example stamping. Again, this stamping produces a recess by directly displacing a flatness zone in shear relative to the sides of the housing component along a continuous unbroken boundary between the flatness zone and the sides. That is to say, the material dislocation takes place along planar boundaries between the flatness zone and the edges, such that the discontinuity between the upper surface of the edges and the upper surface of the flatness zone is approximately superimposed over the discontinuity between the lower surface of the edges and the lower surface of the flatness zone. The resulting substantial flatness of the flatness zone leads to good heat dissipation from the circuit substrates which are glued to the flat housing floor, for example to a cooling block. The housing component according to the present invention is further characterized in that it can be produced in a cost effective process, for example in a stamping process which can be applied in series production at a continuously high quality standard. In this way, cost disadvantages which occur for example in machining production are avoided and in particular the problem is solved that rework of conductors, such as metal pins protruding from the plate is not necessary.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A housing component, comprising:
a substantially plate-shaped form adjoining a plurality of sides, said plurality of sides continuously encompassing said substantially plate-shaped form;
a plurality of feedthroughs extending through at least one of said plurality of sides;
one flatness zone having a deviation from flatness of ≤0.1 millimeter (mm) per a 10 mm length formed in said substantially plate-shaped form; and
a recess defined by said one flatness zone, the housing component being reinforced through said recess and said flatness zone, said recess being formed such that said flatness zone is directly displaced in shear from said plurality of sides continuously encompassing said substantially plate-shaped form along a continuous unbroken boundary between said flatness zone and said plurality of sides.

2. The housing component according to claim 1, the housing component being for a housing for a plurality of electronics.

3. The housing component according to claim 2, the housing for said plurality of electronics being for a transmission control.

4. The housing component according to claim 1, said deviation from flatness being within a range between approximately 0.0005 and 0.02 mm per said 10 mm length.

5. The housing component according to claim 1, said plurality of sides being four sides, said plurality of feedthroughs being arranged along at least one of said four sides.

6. The housing component according to claim 5, wherein said plurality of feedthroughs are arranged along three of said four sides of said substantially plate-shaped form.

7. The housing component according to claim 1, wherein each feedthrough includes a feedthrough opening in which at least one metallic conductor is inserted.

8. The housing component according to claim 7, said at least one metallic conductor being a pin-shaped conductor.

9. The housing component according to claim 8, said pin-shaped conductor including a metal pin with a metal head.

10. The housing component according to claim 7, further comprising a sealing material inserted into said feedthrough opening with said at least one metallic conductor.

11. The housing component according to claim 10, said sealing material being one of a glass material and a glass ceramic material.

12. The housing component according to claim 1, the housing component further comprising an embossing formed as a seal.

13. The housing component of claim 1, wherein:
said housing component being made of a metal.

14. The housing component of claim 1, wherein:
said recess being filled with an adhesive.

15. The housing component according to claim 1, wherein:
said recess being formed using a stamping process.

16. A transmission control, the transmission control comprising:
a housing including a housing component having:
a substantially plate-shaped form adjoining a plurality of sides, said plurality of sides continuously encompassing said substantially plate-shaped form;
a plurality of feedthroughs extending through at least one of said plurality of sides;
one flatness zone having a deviation from flatness of ≤0.1 millimeter (mm) per a 10 mm length formed in said substantially plate-shaped form; and
a recess defined by of said one flatness zone, the housing component being reinforced through said recess and said flatness zone, said recess being formed such that said flatness zone is directly displaced in shear from said plurality of sides continuously encompassing said substantially plate-shaped form along a continuous unbroken boundary between said flatness zone and said plurality of sides;
a circuit substrate connected with said housing component in said flatness zone.

17. The transmission control according to claim 16, said circuit substrate connected with said housing component in said flatness zone through adhesion.

18. The transmission control of claim 16, wherein:
said plurality of feedthroughs being arranged along at least one of said plurality of sides.

19. The transmission control of claim 16, wherein:
each of said plurality of feedthroughs includes a feedthrough opening in which at least one metallic conductor is inserted.

20. The transmission control of claim 19, further comprising:
a sealing material inserted into said feedthrough opening with said at least one metallic conductor.

21. The transmission control of claim 20, wherein:
said sealing material being one of a glass material and a glass ceramic material.

22. The transmission control of claim 16, wherein:
said housing component further having an embossing formed as a seal.

23. The transmission control of claim 16, wherein:
said housing being made from a metal.

24. The transmission control according to claim 16, wherein:
said recess being formed using a stamping process.

\* \* \* \* \*